United States Patent
Watchowski et al.

(10) Patent No.: US 7,350,338 B1
(45) Date of Patent: Apr. 1, 2008

(54) PORTABLE STORAGE PROTECTION DEVICE

(76) Inventors: Mark A. Watchowski, T 937 Road 1, Grand Rapids, OH (US) 43522; Loretta S. Watchowski, T 937 Road 1, Grand Rapids, OH (US) 43522

( * ) Notice: Subject to any disclaimer, the term of this patent is extended or adjusted under 35 U.S.C. 154(b) by 0 days.

(21) Appl. No.: 11/065,628

(22) Filed: Feb. 25, 2005

(51) Int. Cl.
*B65B 31/00* (2006.01)

(52) U.S. Cl. .............. 53/510; 53/79; 53/403; 53/434

(58) Field of Classification Search .......... 53/79, 53/403, 427, 432, 510, 512, 434; 206/497, 206/543, 544, 829
See application file for complete search history.

(56) References Cited

U.S. PATENT DOCUMENTS

| | | | |
|---|---|---|---|
| 2,672,268 A | | 3/1954 | Bower |
| 3,429,095 A | * | 2/1969 | Huson .................. 53/399 |
| 3,458,966 A | * | 8/1969 | Hullhorst et al. ........ 53/430 |
| 3,653,497 A | | 4/1972 | Hornstein |
| 3,965,652 A | * | 6/1976 | Cimins .................. 53/567 |
| 3,968,620 A | * | 7/1976 | Keltner ................. 53/434 |
| 4,055,931 A | * | 11/1977 | Myers .................. 53/408 |
| 4,101,292 A | * | 7/1978 | Hogan, II .............. 44/534 |
| RE30,098 E | | 9/1979 | Titchenal et al. |
| 4,575,989 A | * | 3/1986 | Hannen ................ 53/434 |
| 4,773,456 A | | 9/1988 | Rodgers |
| D324,024 S | | 2/1992 | Nagele et al. |
| 5,287,680 A | * | 2/1994 | Lau .................... 53/512 |
| 5,623,812 A | | 4/1997 | Todt |
| 5,724,748 A | * | 3/1998 | Brooks et al. ............ 34/90 |
| 5,873,217 A | * | 2/1999 | Smith .................. 53/434 |
| 6,155,027 A | * | 12/2000 | Brooks ................. 53/434 |
| 6,952,906 B2 | * | 10/2005 | Nelson ................. 53/434 |
| 2002/0124532 A1 | * | 9/2002 | Villers ................. 53/432 |

* cited by examiner

*Primary Examiner*—Thanh K. Truong

(57) ABSTRACT

A vacuum storage device includes an impermeable shrink-wrap package having an opening formed at one end portion thereof and a transportable vacuum mechanism. The vacuum mechanism includes a housing including a fan disposed therein and at least one outlet. The vacuum mechanism further includes a power cord electrically coupled to the fan and a cylindrical conduit having opposed end portions attachable to the housing and removably positionable through the package. One end portion of the conduit has a flange for assisting to maintain the conduit at a substantially stable position during operating conditions.

6 Claims, 3 Drawing Sheets

PORTABLE STORAGE PROTECTION DEVICE

CROSS REFERENCE TO RELATED APPLICATIONS

Not Applicable.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

1. Technical Field

This invention relates to storage devices and, more particularly, to a vacuum-sealed storage device for large items.

2. Prior Art

The use of vacuum storage devices is well known in the prior art. These devices are usually used on smaller items such as food and clothing. Vacuum packaging in heat sealable plastic bags is a conventional way of packaging food items such as poultry, meat, and cheese. Vacuum packaging typically involves placing the item in a heat sealable plastic bag and then evacuating air from the bag and thus collapsing it about the item. The bag is then heat sealed in its evacuated condition so the item becomes encased in a generally air-free environment. Typically, the bag is a heat shrinkable bag, and after the heat sealing step, is advanced to a hot water or hot air shrink tunnel to induce shrinkage of the bag around the item.

One difficulty encountered in vacuum packaging of the instant character is that the items to be packaged are not uniform in size and shape. Still another difficulty is that the surfaces of meats, both raw and processed (e.g., bacon), are slightly damp and, moreover, tend to be tacky. These problems all cause difficulty in attaining full evacuation of the packaging bags and full suppression of generation of gases conducive to decomposition, and have required considerable preconditioning.

It would be beneficial to protect larger items by the same method for various reasons. Larger items, such as motorcycles, snowmobiles, lawn mowers, garden tractors, edgers, chain saws, microwave ovens, washers, dryers, television sets, and power tools are frequently stored for long periods of time due to their seasonal nature or because they are not presently needed by the user, but may be needed in the future and are costly to replace if thrown away or sold. When stored, these items often suffer damage due to their inactivity and an accumulation of dust and other contaminants from the air. Such damage could be mitigated if a device were available to vacuum seal these items and protect them from the environment while being stored.

Accordingly, a need remains for a vacuum storage device for large items in order to overcome the above-noted shortcomings. The present invention satisfies such a need by providing a storage device that is easy to use, versatile in function, and provides physical protection to equipment stored therein. Such a vacuum storage device allows an individual to effectively store large items, including motorcycles, snowmobiles, lawnmowers, and the like, from rain, dust, hail, bird droppings, and airborne contaminants.

BRIEF SUMMARY OF THE INVENTION

In view of the foregoing background, it is therefore an object of the present invention to provide a portable vacuum storage device for home use. These and other objects, features, and advantages of the invention are provided by a storage device for protecting objects from environmental contaminants.

The device includes an impermeable shrink-wrap package sized and shaped for housing objects for seasonal storage. Such a package has an opening formed at one end portion thereof and is formed from substantially transparent material so that a user can conveniently view the items stored therein.

A transportable vacuum device selectively removes air from the package so that the item portions advantageously become firmly attached to the package wherein air pressure is maintained at a static level. Such a vacuum device includes a housing including a rotatable fan centrally disposed therein and provided with at least one outlet for exhausting air outwardly therefrom.

The vacuum device further includes a power cord electrically coupled to the fan for allowing a user to power the vacuum device via a 110-volt power outlet. A cylindrical conduit having opposed end portions is attachable to the housing and is removably positionable through the package opening respectively.

Such a conduit has a predetermined diameter sufficient for conveniently channeling air away from the package at a rate desired by a user. One end portion of the conduit includes a flange for conveniently assisting to maintain the conduit at a substantially stable position during operating conditions. The device may be provided with an inlet in fluid communication with the conduit for effectively directing air through the outlets of the housing.

BRIEF DESCRIPTION OF THE SEVERAL VIEWS OF THE DRAWING

The novel features believed to be characteristic of this invention are set forth with particularity in the appended claims. The invention itself, however, both as to its organization and method of operation, together with further objects and advantages thereof, may best be understood by reference to the following description taken in connection with the accompanying drawings in which:

DETAILED DESCRIPTION OF THE INVENTION

The present invention will now be described more fully hereinafter with reference to the accompanying drawings, in which a preferred embodiment of the invention is shown. This invention may, however, be embodied in many different forms and should not be construed as limited to the embodiments set forth herein. Rather, this embodiment is provided so that this application will be thorough and complete, and will fully convey the true scope of the invention to those skilled in the art. Like numbers refer to like elements throughout the figures.

Figure 1:
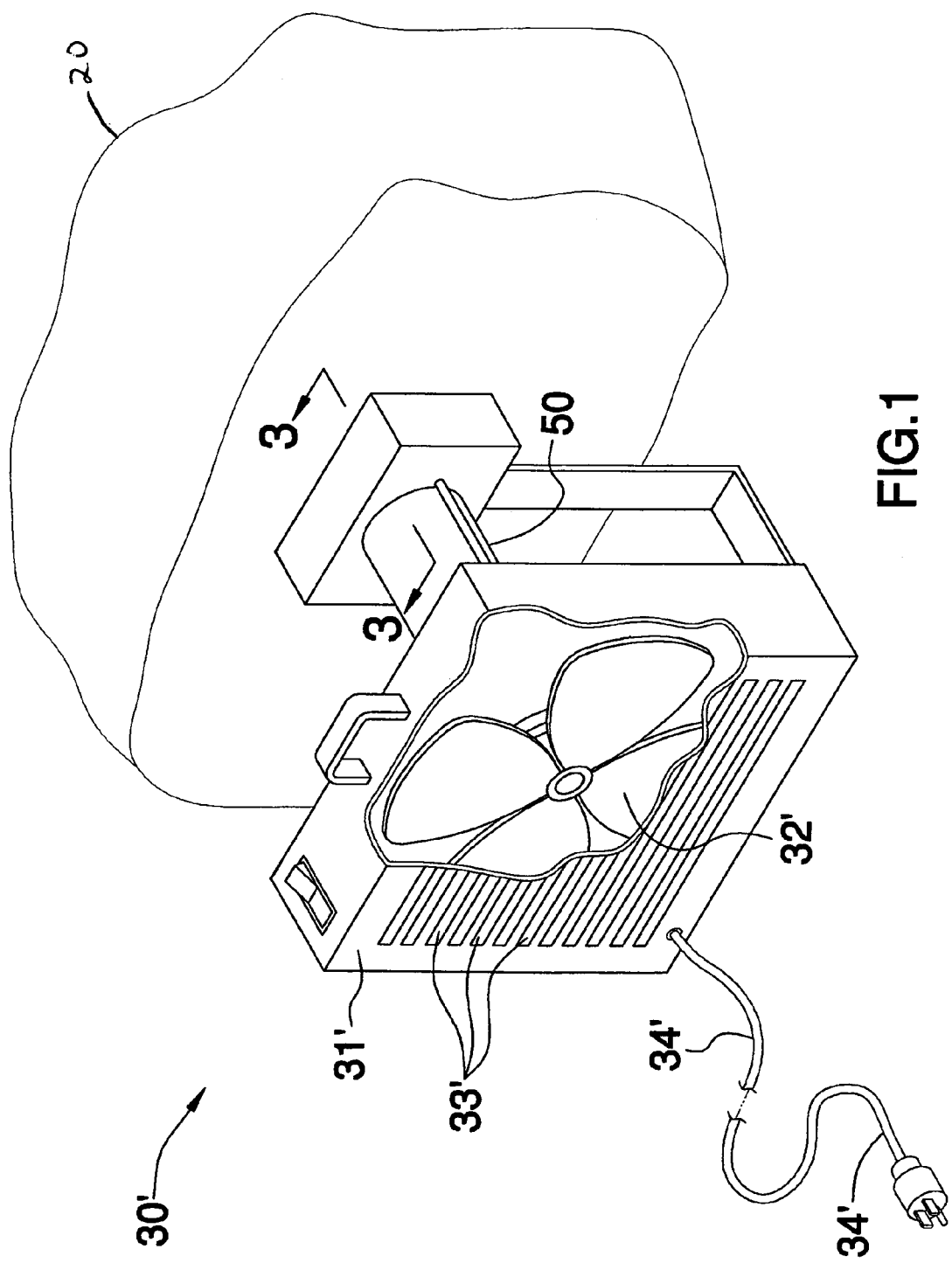
FIG. 1 is a perspective view showing a portable vacuum storage system device, in accordance with the present invention.
Figure 2:
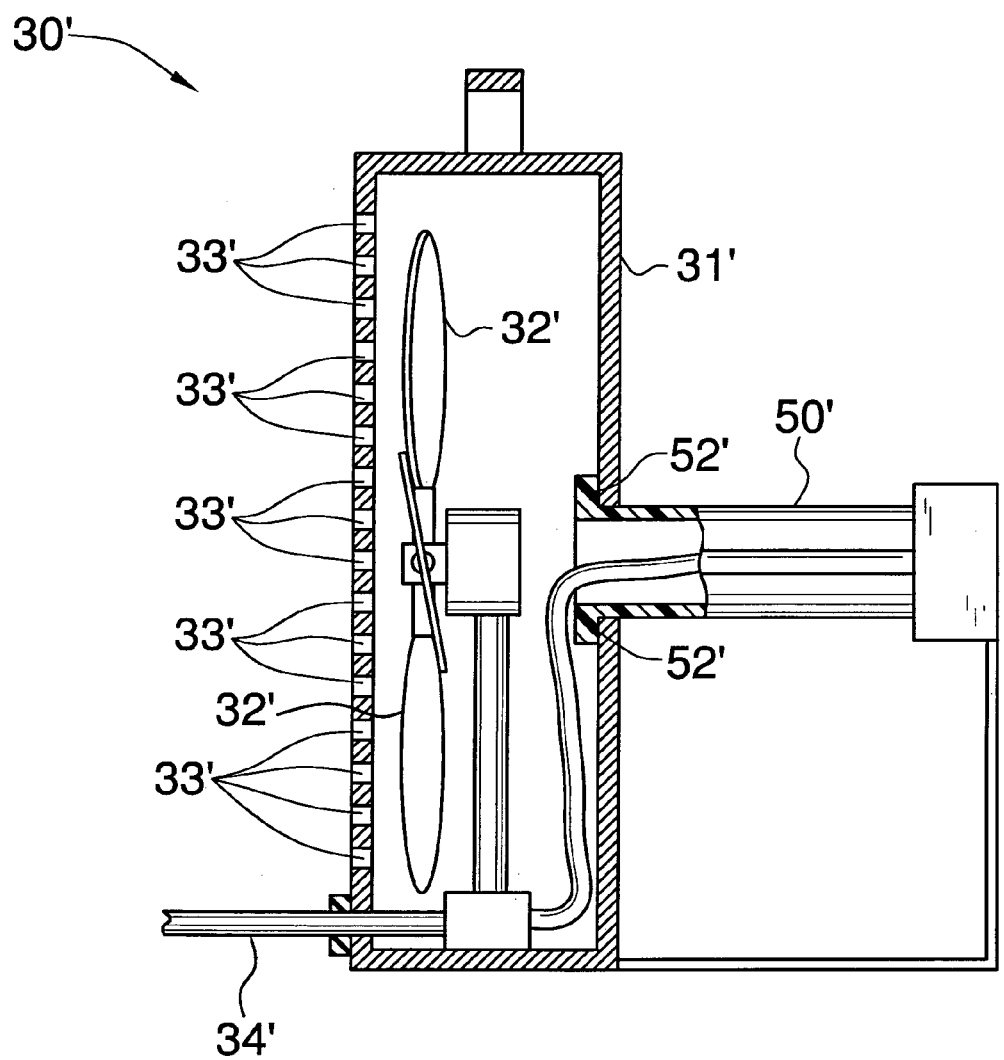
FIG. 2 is a cross-sectional view of the device shown in FIG. 1, showing the fan and power cord.
Figure 3:
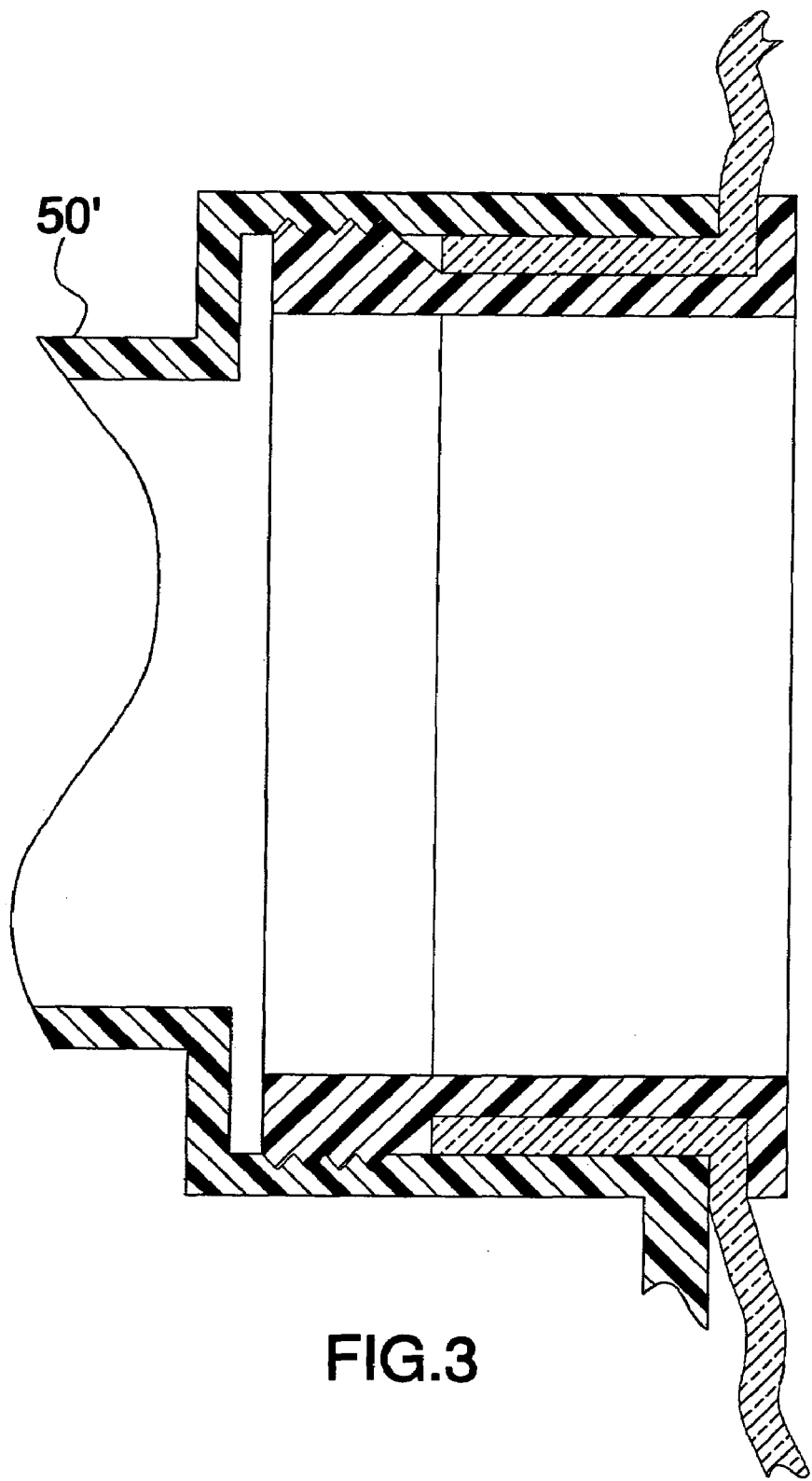
FIG. 3 is a cross-sectional view of the device shown in FIG. 1, taken along line 3-3.

The device of this invention is referred to generally in FIGS. 1-3 by the reference numeral 10 and is intended to provide a portable vacuum storage device for household objects. It should be understood that the apparatus 10 may be used to store and protect many different types of items and should not be limited to storing and protecting only machinery.

Referring initially to FIG. 1, the device 10 includes an impermeable shrink-wrap package 20 sized and shaped for housing objects for storage or seasonal items during their off season. Such a package 20 has an opening 21 formed at one end portion thereof, as shown in FIG. 3, and is formed from substantially transparent material so that a user can conveniently view the items stored therein. The package 20 includes an outer edge portion extending along the opening. Such an outer edge portion includes flexible upper 22 and lower 23 adhesive layers for being affixed to each other after the conduit 50 (described herein below) is removed from the package 20 so that the package can advantageously maintain static air pressure during an extended time period, thus preventing the items stored therein from being exposed to harmful elements, as best shown in FIG. 3.

Referring to FIGS. 1 and 2, a transportable vacuum device 30 selectively removes air from the package 20 so that the item portions advantageously become firmly attached to the package 20 wherein air pressure is maintained at a static level. Such a vacuum device 30 includes a housing 31 including a rotatable fan 32 centrally disposed therein and provided with at least one outlet 33 for exhausting air outwardly therefrom.

Referring to FIGS. 1 and 2, the vacuum device 30 further includes a power cord 34 electrically coupled to the fan 32 for allowing a user to power the vacuum device 30 via a 110-volt power outlet. A cylindrical conduit 50 having opposed end portions 51a, 51b is attachable to the housing 31 and removably positionable through the package opening 21 respectively. The device 10 is provided with an inlet 35 in fluid communication with the conduit 50 for effectively directing air through the outlets 33 of the housing 31. One end portion 51a includes a flange portion 52 positioned adjacent to the outlets 33 of the housing 31 for maintaining the conduit 50 at a substantially stable position during operating conditions.

Another end portion 51b is threadably engageable with the inlet 35 in such a manner to define a sleeve 53 therebetween for receiving an outer perimeter of package 20. The package 20 is effectively maintained at a substantially sable position when intercalated between inlet 35 and end portion 51b because it is situated downstream the threaded portions of inlet 35 and end portion 51b. Such a strategic and critical positioning of the package 20 perimeter allows a large volume of air to be withdrawn therefrom without separating air-tight connection between the conduit 50 and inlet 35. In particular, the conduit 50 remains in fluid communication with the inlet 35 for directing air through the outlets 33 of the housing 31. Such a conduit 50 has a predetermined diameter sufficient for conveniently channeling air away from the package 20 at a rate desired by a user.

Referring to FIGS. 1, 2 and 3, the vacuum device 30 further includes a motor 60 having a drive shaft 61 operably connected thereto and extending outwardly therefrom. Such a drive shaft 61 is rotatable in alternate radial paths as desired by a user.

While the invention has been described with respect to certain a specific embodiment, it will be appreciated that many modifications and changes may be made by those skilled in the art without departing from the spirit of the invention. It is intended, therefore, by the appended claims to cover all such modifications and changes as fall within the true spirit and scope of the invention.

In particular, with respect to the above description, it is to be realized that the optimum dimensional relationships for the parts of the present invention may include variations in size, materials, shape, form, function and manner of operation. The assembly and use of the present invention are deemed readily apparent and obvious to one skilled in the art.

What is claimed as new and what is desired to secure by Letters Patent of the United States is:

1. A storage device for protecting oversized items from environmental contaminants, said device comprising:

an impermeable shrink-wrap package sized and shaped for housing a portion of the oversized items therein, said package having an opening formed at one end portion thereof, said package being formed from substantially transparent material so that a user can view the items stored therein; and a transportable vacuum device for selectively removing air from said package so that said item portions become firmly attached to said package wherein air pressure is maintained at a static level, said vacuum device comprising a housing including a rotatable fan centrally disposed therein and provided with at least one outlet for exhausting air outwardly therefrom, a power cord electrically coupled to the fan for allowing a user to power said vacuum device through a 110-volt power outlet, and a conduit having opposed end portions attachable thereto and removably positionable through the package opening respectively, said conduit having a predetermined diameter sufficient for channeling air away from said package at a rate desired by a user, and an inlet in fluid communication with said conduit for directing air through said outlets of said housing, said inlet being coupled to said at least one outlet;

wherein one said end portions of said conduit is threadably engageable with said inlet in such a manner to define a diametrically nested sleeve for receiving an outer perimeter of said package therebetween, said one end portion of said conduit being directly connected to said Inlet, an opposite one of said end portions of said conduit being directly abutted against said at least one outlet, said conduit having a linear shape and being formed from rigid material such that said conduit maintains a static and linear shape during operating conditions;

wherein said one end portion of said conduit has an inwardly tapered lip for defining a sleeve between said inlet respectively, said sleeve housing said end portion of said shrink-wrap when said conduit and said inlet are threadably engaged;

wherein said vacuum device further comprises a motor including a drive shaft operably connected thereto and extending outwardly therefrom, said drive shaft being rotatable in a counter clockwise direction as desired by a user.

2. The storage device of claim 1, wherein said one end portion comprising: a flange portion positioned adjacent to said outlets of said housing for maintaining said conduit at a substantially stable position during operating conditions, said flange portion being disposed inside said housing.

3. The storage device of claim 1, wherein said package comprises: an outer edge portion extending along the opening.

4. A storage device for protecting oversized items from environmental contaminants, said device comprising:
   an impermeable shrink-wrap package sized and shaped for housing a portion of the oversized items therein, said package having an opening formed at one end portion thereof, said package being formed from substantially transparent material so that a user can view the items stored therein; and
   a transportable vacuum device for selectively removing air from said package so that said item portions become firmly attached to said package wherein air pressure is maintained at a static level, said vacuum device comprising
      a housing including a rotatable fan centrally disposed therein and provided with at least one outlet for exhausting air outwardly therefrom,
      a power cord electrically coupled to the fan for allowing a user to power said vacuum device through a 110-volt power outlet,
      a cylindrical conduit having opposed end portions attachable to said housing and removably positionable through the package opening respectively, said conduit having a predetermined diameter sufficient for channeling air away from said package at a rate desired by a user, one end portion of said conduit having a flange for assisting to maintain said conduit at a substantially stable position during operating conditions, and
      an inlet in fluid communication with said conduit for directing air through said outlets of said housing, said inlet being coupled to said at least one outlet;
   wherein said one end portion is threadably engageable with said inlet in such a manner to define a diametrically nested sleeve for receiving an outer perimeter of said package therebetween;
   wherein said one end portion of said conduit has an inwardly tapered lip for defining a sleeve between said inlet respectively, said sleeve housing said end portion of said shrink-wrap when said conduit and said inlet are threadably engaged;
   wherein said vacuum device further comprises a motor including a drive shaft operably connected thereto and extending outwardly therefrom, said drive shaft being rotatable in a counter clockwise direction as desired by a user.

5. The storage device of claim 4, wherein said one end portion comprising: a flange portion positioned adjacent to said outlets of said housing for maintaining said conduit at a substantially stable position during operating conditions, said flange portion being disposed inside said housing.

6. The storage device of claim 4, wherein said package comprises: an outer edge portion extending along the opening.

* * * * *